(12) United States Patent
Pompei

(10) Patent No.: US 10,869,127 B2
(45) Date of Patent: Dec. 15, 2020

(54) AMPLIFIER INTERFACE AND AMPLIFICATION METHODS FOR ULTRASOUND DEVICES

(71) Applicant: Frank Joseph Pompei, Wayland, MA (US)

(72) Inventor: Frank Joseph Pompei, Wayland, MA (US)

(*) Notice: Subject to any disclaimer, the term of this patent is extended or adjusted under 35 U.S.C. 154(b) by 289 days.

(21) Appl. No.: 15/859,905

(22) Filed: Jan. 2, 2018

(65) Prior Publication Data

US 2018/0192194 A1     Jul. 5, 2018

Related U.S. Application Data

(60) Provisional application No. 62/441,468, filed on Jan. 2, 2017.

(51) Int. Cl.
| | |
|---|---|
| *H04R 3/04* | (2006.01) |
| *H03F 3/217* | (2006.01) |
| *B06B 1/02* | (2006.01) |
| *H03F 3/183* | (2006.01) |

(52) U.S. Cl.
CPC ............ *H04R 3/04* (2013.01); *B06B 1/0215* (2013.01); *B06B 1/0246* (2013.01); *H03F 3/183* (2013.01); *H03F 3/217* (2013.01); *H03F 3/2171* (2013.01); *H03F 3/2173* (2013.01); *H03F 2200/171* (2013.01)

(58) Field of Classification Search
CPC . H04R 3/00; H04R 3/002; H04R 3/04; H04R 3/08; H04R 2217/03; H03F 3/183; H03F 3/217; H03F 3/2171; H03F 3/2173; H03F 2200/171; B06B 1/0215; B06B 1/0246

USPC ............ 381/111–117, 120, 59, 96; 310/334; 330/10, 251, 207 A; 367/137

See application file for complete search history.

(56) References Cited

U.S. PATENT DOCUMENTS

| | | | | |
|---|---|---|---|---|
| 4,588,917 | A * | 5/1986 | Ratcliff | B06B 1/0253 310/26 |
| 6,914,991 | B1 * | 7/2005 | Pompei | H04R 3/00 381/111 |
| 7,244,007 | B2 * | 7/2007 | Ishizaki | B41J 2/04541 323/268 |
| 7,391,872 | B2 | 6/2008 | Pompei | |
| 7,667,444 | B2 | 2/2010 | Mevay et al. | |
| 8,027,488 | B2 | 9/2011 | Pompei | |
| 8,538,036 | B2 | 9/2013 | Pompei | |
| 8,755,539 | B2 * | 6/2014 | Huang | H04R 3/00 330/195 |
| 8,953,821 | B2 | 2/2015 | Pompei | |
| 9,036,827 | B2 | 5/2015 | Pompei | |
| 9,681,225 | B2 | 6/2017 | Pompei | |

(Continued)

*Primary Examiner* — Xu Mei
(74) *Attorney, Agent, or Firm* — BainwoodHuang

(57) ABSTRACT

Amplifier architecture that allows low-cost class-D audio amplifiers to be compatible with ultrasonic signals, as well as loads presented by thin-film ultrasonic transducers. The amplifier architecture replaces the traditional capacitor used as an output filter in the class-D amplifier with the natural capacitance of the ultrasonic transducer load, and employs relative impedance magnitudes to create an under-damped low-pass filter that boosts voltage in the ultrasonic frequency band of interest. The amplifier architecture includes a secondary feedback loop to ensure that correct output voltage levels are provided.

13 Claims, 3 Drawing Sheets

(56) References Cited

U.S. PATENT DOCUMENTS

2004/0047477 A1* 3/2004 Bank ................... H03F 3/2178
                                                  381/120
2007/0121970 A1* 5/2007 Miyazaki ................ H04R 3/06
                                                  381/116
2016/0269833 A1* 9/2016 Norris .................. H04R 17/005

* cited by examiner

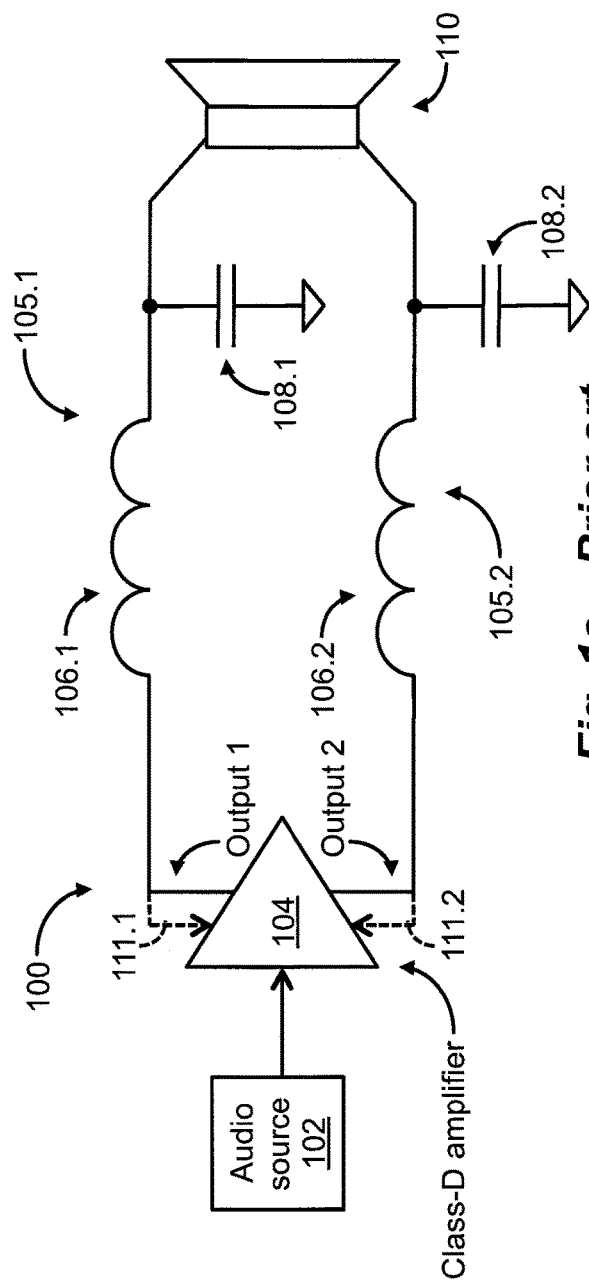
Fig. 1a – Prior art
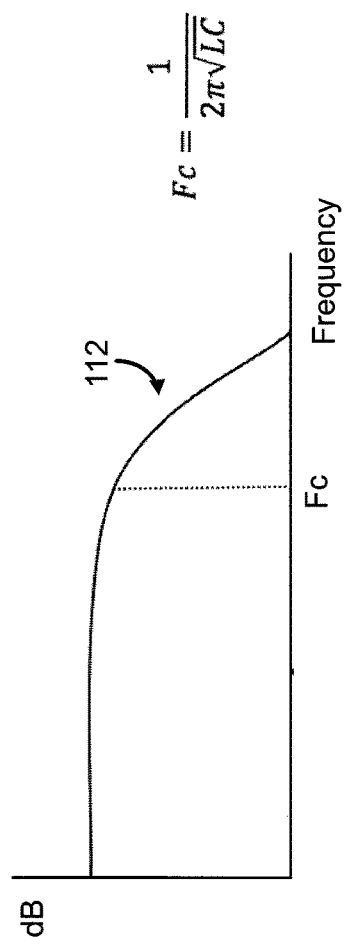
Fig. 1b – Prior art

AMPLIFIER INTERFACE AND AMPLIFICATION METHODS FOR ULTRASOUND DEVICES

CROSS REFERENCE TO RELATED APPLICATIONS

This patent application claims benefit of the priority of U.S. Provisional Patent Application No. 62/441,468 filed Jan. 2, 2017 entitled AMPLIFIER INTERFACE AND METHODS FOR ULTRASOUND.

BACKGROUND

Amplifying ultrasonic signals has traditionally been both challenging and costly. The frequency range required for such amplification is beyond most audio amplifier capabilities, and the highly capacitive load presented by an ultrasonic transducer is significantly different from the weakly inductive and mostly resistive load presented by a loudspeaker. Further, for many ultrasonic transducers, a much higher drive voltage (e.g., about 200-300 Vpp) is required compared with the drive voltage required for loudspeakers. For at least these reasons, ultrasonic amplifiers, whether designed to be linear or switching, are generally custom made to suit a specific application and/or device.

Class-D amplifiers were once relegated to subwoofer use, but are now capable of reproducing signals in the audio frequency band (i.e., 20-20,000 Hz) with good fidelity and at low cost, due in no small part to advancements made in the field of semiconductor technology. Recent class-D amplifier designs compatible with 192 kHz sample rate audio signals are now theoretically capable of driving up to one-half of this sample rate, or 96 kHz, which is well into a useful ultrasound frequency range. Such class-D amplifier designs are desirable because they are currently being manufactured in high quantities, and are generally available at low cost in a convenient "module" amplifier package, which typically includes signal processing, pulse width modulation, switch driving, power semiconductors, as well as amplifier protection and feedback correction. However, while such class-D amplifier designs theoretically allow high-frequency ultrasound reproduction, they generally do not permit practical use with ultrasonic transducers or parametric loudspeaker systems.

SUMMARY

In accordance with the present application, amplifier architecture is disclosed that allows low-cost class-D audio amplifiers to be compatible with ultrasonic signals, as well as loads presented by thin-film ultrasonic transducers. The disclosed amplifier architecture replaces the traditional capacitor used as an output filter in the class-D amplifier with the natural capacitance of the ultrasonic transducer load, and employs relative impedance magnitudes to create an under-damped low-pass filter that boosts voltage in the ultrasonic frequency band of interest. The disclosed amplifier architecture includes a secondary feedback loop to ensure that correct output voltage levels are provided.

In certain embodiments, an amplifier interface for driving an ultrasonic transducer is provided that includes a switch mode type amplifier configured to receive an ultrasonic signal, and an inductor coupled between the switch mode type amplifier and the ultrasonic transducer. The inductor has an associated inductance value, and the ultrasonic transducer has an associated capacitance value. The inductance value of the inductor and the capacitance value of the ultrasonic transducer form a low-pass filter for removing high frequency artifacts produced by the switch mode type amplifier, which can be configured as a class-D amplifier. The low-pass filter has an associated frequency response, and the inductance value and the capacitance value are selected to produce a voltage boost in the frequency response at about a center of an ultrasonic frequency band of interest.

In certain further embodiments, the amplifier interface can include a digital signal processor (DSP) coupled to an input of the switch mode type amplifier, and a feedback path disposed between the ultrasonic transducer and the DSP. The ultrasonic transducer is configured to produce an output signal, and the feedback path is configured to provide a signal representative of a level of the output signal to the DSP. The DSP is configured to correct the level of the output signal in response to variations in one or more of the inductance value of the inductor and the capacitance value of the ultrasonic transducer. The amplifier interface can also include a transformer disposed between the switch mode type amplifier and the inductor.

In certain additional embodiments, the ultrasonic transducer is configured as a thin-film ultrasonic transducer. The amplifier interface further includes a DC bias circuit configured to provide a DC bias voltage to the thin-film ultrasonic transducer. The DC bias circuit includes a DC bias generator, an isolation capacitor disposed between the inductor and the ultrasonic transducer, and an isolation resistor disposed between the ultrasonic transducer and the DC bias generator.

Other features, functions, and aspects of the invention will be evident from the Detailed Description that follows.

BRIEF DESCRIPTION OF THE DRAWINGS

The foregoing and other objects, features, and advantages will be apparent from the following description of particular embodiments of the invention, as illustrated in the accompanying drawings in which like reference characters refer to the same parts throughout the different views.

FIG. 1a is a schematic diagram of a conventional amplifier interface for driving a loudspeaker;

FIG. 1b is a diagram of an exemplary frequency response provided by the amplifier interface of FIG. 1a;

FIG. 2b is a diagram of an exemplary frequency response provided by the amplifier interface of FIG. 2a; and FIG. 3 is a diagram of a practical frequency response and phase response provided by the amplifier interface of FIG. 2a.

DETAILED DESCRIPTION

Figure 2A:
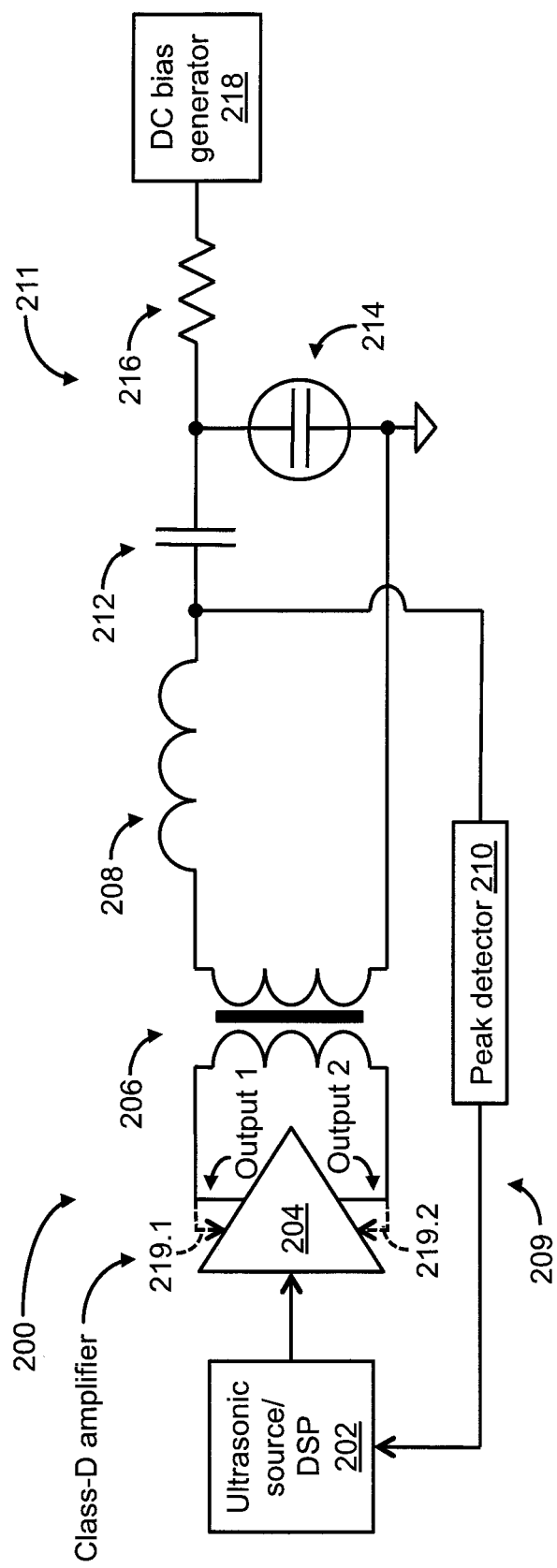
FIG. 2a is a schematic diagram of an exemplary amplifier interface for driving an ultrasonic transducer.

The disclosure of U.S. Provisional Patent Application No. 62/441,468 filed Jan. 2, 2017 entitled AMPLIFIER INTERFACE AND METHODS FOR ULTRASOUND is hereby incorporated herein by reference in its entirety.

Amplifier architecture is disclosed that allows low-cost class-D audio amplifiers to be compatible with ultrasonic signals, as well as loads presented by thin-film ultrasonic transducers. The disclosed amplifier architecture replaces the traditional capacitor used as an output filter in the class-D amplifier with the natural capacitance of the ultrasonic transducer load, and employs relative impedance magnitudes to create an under-damped low-pass filter that boosts voltage in the ultrasonic frequency band of interest. The disclosed amplifier architecture includes a secondary feedback loop to ensure that correct output voltage levels are provided.

FIG. 1a depicts an illustrative embodiment of a conventional amplifier interface 100 for driving a loudspeaker 110. As shown in FIG. 1a, the amplifier interface 100 includes a class-D (switch mode type) amplifier 104, and a pair of low-pass (L-C) filters 105.1, 105.2. The low-pass filter 105.1 includes an inductor 106.1 and a capacitor 108.1. Likewise, the low-pass filter 105.2 includes an inductor 106.2 and a capacitor 108.2. In the illustrative embodiment of FIG. 1a, the class-D amplifier 104 can be configured to include a full-bridge (or H-bridge) output stage, which provides a pair of outputs (Output 1, Output 2) for driving the loudspeaker 110. It is noted, however, that the class-D amplifier 104 may alternatively be configured to include a half-bridge output stage or any other suitable output stage configuration.

In an exemplary mode of operation, an audio source 102 produces an audio signal in the audio frequency band (i.e., 20-20,000 Hz), and provides the audio signal to an input of the class-D amplifier 104, which includes suitable components for synthesizing and amplifying pulse width modulated (PWM) signals based on the audio input signal, as known in the art. The PWM signals include the audio signal to be reproduced at the loudspeaker 110, as well as high frequency switching artifacts outside the audible frequency band. The class-D amplifier 104 provides a PWM signal at each of its Outputs 1, 2, which, in turn, provide the respective PWM signals to the low-pass filters 105.1, 105.2. The low-pass filter 105.1 is configured to filter the PWM signal at the Output 1 of the class-D amplifier 104 to remove the high frequency switching artifacts from the respective PWM signal. Likewise, the low-pass filter 105.2 is configured to filter the PWM signal at the Output 2 of the class-D amplifier 104 to remove the high frequency switching artifacts from the respective PWM signal. Having removed the high frequency switching artifacts from the PWM signals, the low-pass filters 105.1, 105.2 provide the audio signal in the audio frequency band to the loudspeaker 110 for subsequent reproduction.

FIG. 1b depicts an exemplary frequency response 112 of the low-pass filters 105.1, 105.2 included in the amplifier interface 100 of FIG. 1a. As shown in FIG. 1b, the cutoff frequency, Fc, of the low-pass filters 105.1, 105.2 can be expressed, as follows:

$$Fc = \frac{1}{2\pi\sqrt{LC}}, \quad (1)$$

in which "L" corresponds to the inductance value of the inductors 106.1, 106.2, and "C" corresponds to the capacitance value of the capacitors 108.1, 108.2. It is noted that, for a full-band audio device, the cutoff frequency Fc is typically about 20 kHz.

For enhanced accuracy and lower distortion, the class-D amplifier 104 can employ real-time feedback (generally depicted by arrows 111.1, 111.2; see FIG. 1a) derived from its output stage. The class-D amplifier 104 can process (e.g., filter) the real-time feedback, compare the processed feedback to the audio input signal, and employ a resulting error function to suppress distortion and enhance reproduction accuracy. Because the output filter is flat in the audio frequency band of interest, it is generally not necessary to obtain such feedback from the load presented by the loudspeaker 110, as the output from the class-D amplifier is representative and accurate, at least within the audio frequency band of interest.

FIG. 2a depicts an illustrative embodiment of an amplifier interface 200 for driving an ultrasonic transducer 214, in accordance with the present application. As shown in FIG. 2a, the amplifier interface 200 includes a class-D (switch mode type) amplifier 204, a transformer 206, an inductor 208, a DC bias circuit 211, and a peak detector 210. The DC bias circuit 211 includes an isolation capacitor 212, an isolation resistor 216, and a DC bias generator 218. The transformer 206 is configured to provide isolation and a ground reference, and to allow the impedance seen by the class-D amplifier 204 to be adjusted to a suitable range, as well as allow the output voltage to be adjusted to a suitable level. In the illustrative embodiment of FIG. 2a, the class-D amplifier 204 can be configured to include a full-bridge (or H-bridge) output stage, which provides a pair of outputs (Output 1, Output 2) coupled to an input winding of the transformer 206. It is noted, however, that the class-D amplifier 204 may alternatively be configured to include a half-bridge output stage or any other suitable output stage configuration. Further, for enhanced accuracy and lower distortion, the class-D amplifier 204 can employ real-time feedback (generally depicted by one or more primary feedback paths 219.1, 219.2; see FIG. 2a) derived from its output stage. A compensation filter can also be used to flatten the net ultrasound response of the ultrasonic transducer 214.

Figure 2B:
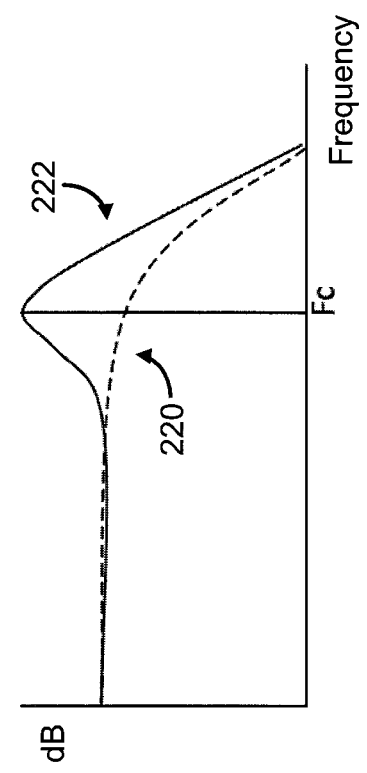

The amplifier interface 200 for driving the ultrasonic transducer 214 (see FIG. 2a) can be contrasted with the conventional amplifier interface 100 for driving the loudspeaker 110 (see FIG. 1a), at least as follows. First, the capacitance provided by the capacitors 108.1, 108.2 included in the low-pass filters 105.1, 105.2 is replaced by the natural capacitance of the ultrasonic transducer 214. This eliminates the need for the capacitors 108.1, 108.2, and, by reducing the total capacitance, reduces the amount of current that the class-D amplifier 204 is required to supply to drive the ultrasonic transducer 214 to a desired voltage level. The capacitance of the ultrasonic transducer 214 can be trimmed by adding a capacitor of a relatively small capacitance value, preferably in parallel with the ultrasonic transducer 214, such that the cutoff frequency Fc (see FIG. 2b) is located in a desired ultrasound frequency range. In addition, the inductance value of the inductor 208 is selected such that a resulting frequency response 222 (see FIG. 2b) has a cutoff frequency, Fc, located approximately in the center of the ultrasonic frequency band of interest. The inductance of the inductor 208 can be trimmed, as desired and/or required, using tunable inductor devices or one or more additional inductors in series or parallel. Because the resistance of the load presented by the ultrasonic transducer 214 is low, the inductance of the inductor 208 and the natural capacitance of the ultrasonic transducer 214 create an under-damped (or "peaking") low-pass filter, as illustrated by the frequency response 222 of FIG. 2b. As shown in FIG. 2b, a strong resonance peak is created at approximately the cutoff frequency Fc, thereby naturally amplifying the output voltage in the desired ultrasonic frequency band. In FIG. 2b, a frequency response 220 (shown in phantom) similar to the frequency response 112 of FIG. 1b is shown for comparison with the under-damped or peaking frequency response 222.

It is noted that the strong resonance peak at the cutoff frequency Fc (see FIG. 2b) allows the frequency response 222 to have characteristics of a band-pass filter. It is further noted that, near the cutoff frequency Fc (see FIG. 2b), the series-resonance combination of the inductor 208 and the natural capacitance of the ultrasonic transducer 214 presents a load to the class-D amplifier 204 that appears to be mostly resistive, thereby making the ultrasonic transducer 214 compatible with standard class-D amplifier modules designed for use with resistive loads.

Because the under-damped or peaking low-pass filter created by the inductance of the inductor 208 and the natural capacitance of the ultrasonic transducer 214 does not have a flat frequency response, and the inductance value of the inductor 208 and the capacitance/resistance value(s) of the ultrasonic transducer 214 may vary and/or drift, the amplifier interface 200 is configured to include a secondary feedback path 209 from a node between the inductor 208 and the capacitor 212 to an ultrasonic source/digital signal processor (DSP) coupled to an input of the class-D amplifier 204. It is noted that the change in phase near the cutoff frequency Fc (see FIG. 2b) can be rapid, and therefore a direct feedback comparison with the output of the amplifier interface 200 can be difficult to implement. For this reason, a slower feedback loop implemented by the secondary feedback path 209 with a signal representative of the output level is employed.

As described herein, the inductance, L, of the inductor 208 and the natural capacitance, C, of the ultrasonic transducer 214 create an under-damped or peaking low-pass filter, as illustrated by the frequency response 222 of FIG. 2b. In one embodiment, the ultrasonic transducer 214 is configured as a thin-film ultrasonic transducer, in which the internal series resistance is relatively small compared to the impedance of L and C in the ultrasound frequency range of interest. Such a thin-film ultrasonic transducer generally requires a high voltage (and a DC bias) for proper operation. For this reason, the broadband, flat frequency response of the class-D amplifier 204 is effectively converted into a band-pass frequency response with voltage boost, which is useful for amplifying band-limited ultrasonic signals centered at the cutoff frequency, Fc, as expressed as in equation (1) above. The magnitude of the voltage boost near the cutoff frequency, Fc, is dependent upon the relative values of L, C, as well as the load resistance. It is noted that there can be a tradeoff between the useful bandwidth and the magnitude of the voltage boost. In an exemplary configuration of the amplifier interface 200, a 24 Vdc power supply can be used to drive the ultrasonic transducer load to 200-500 Vpp near the cutoff frequency, Fc, allowing maximum drive limits of the ultrasonic transducer load to be reached over a reasonable bandwidth. It is further noted that a carrier frequency of a modulated ultrasonic signal produced by the ultrasonic transducer 214 can be selected to be near the cutoff frequency, Fc. For certain types of ultrasonic signal modulation, such as single side-band (SSB), the cutoff frequency, Fc, can be approximately at the center of the ultrasonic frequency band of interest.

Figure 3:
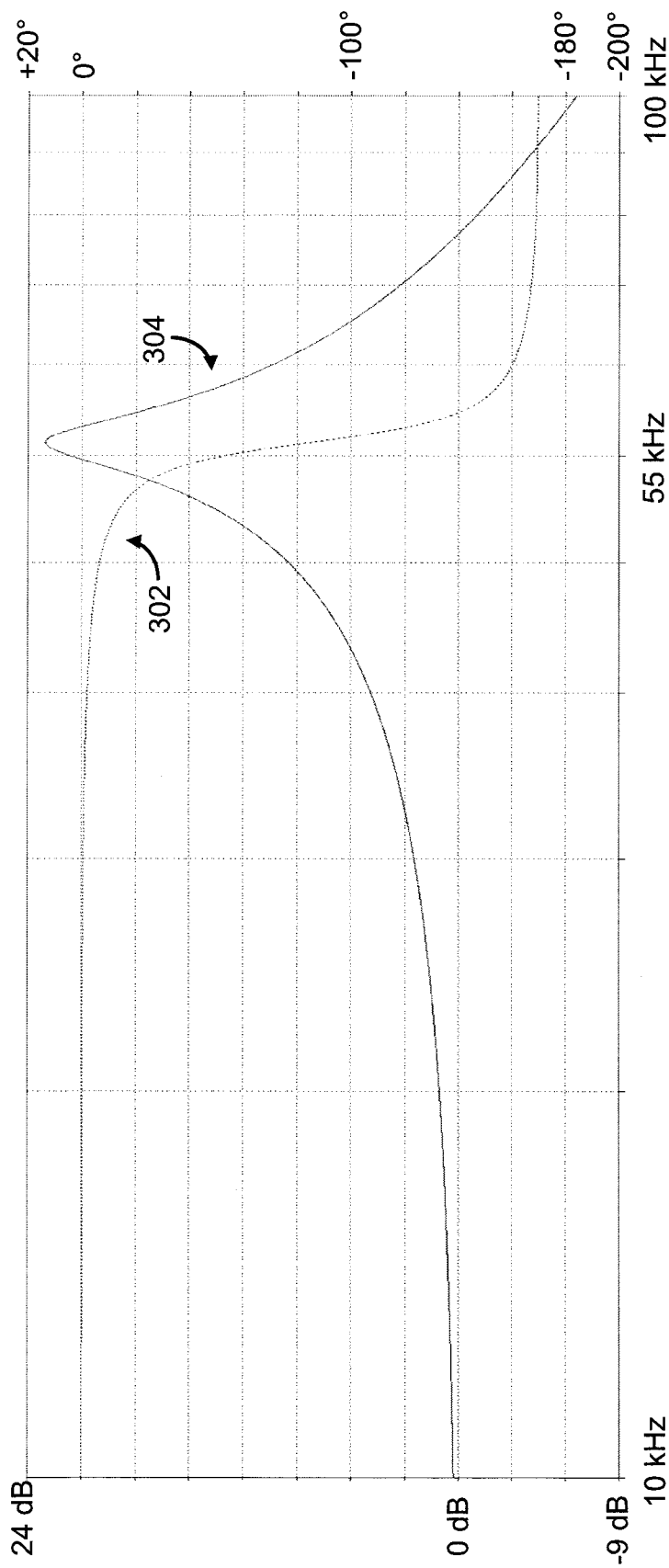

FIG. 3 depicts an illustrative phase response 302 and frequency response 304 of the under-damped or peaking low-pass filter created by the inductance, L, of the inductor 208, and the natural capacitance, C, of the ultrasonic transducer 214. Exemplary values of the inductance, L, of the inductor 208, the natural capacitance, C, of the ultrasonic transducer 214, as well as the internal series resistance of the ultrasonic transducer 214, are 80 uH, 100 nF, and 2Ω, respectively. As shown in FIG. 3, the frequency response 304 provides a voltage boost of about 23 dB at a cutoff frequency (Fc) of about 56 kHz, thereby boosting the voltage level at the ultrasonic transducer load by a factor of over ten (10) and, for nearby frequencies, providing a voltage boost of about a factor of four (4) or more over a bandwidth of about 14 kHz. Because the frequency response 304 rolls off at higher frequencies, high frequency switching harmonics are effectively eliminated (i.e., filtered out) from the output of the class-D amplifier 204. It is noted that proper selection of the inductance, L, of the inductor 208 in conjunction with the natural capacitance, C, of the ultrasonic transducer 214 ensures that the load seen by the class-D amplifier 204 is mostly resistive, at least in the ultrasonic frequency band of interest. The class-D amplifier 204, which is typically designed for use with resistive loads, can therefore be used to drive the load of the ultrasonic transducer 214 at high voltage both efficiently and at low cost.

As described herein, the transformer 206 can be included in the amplifier interface 200 of FIG. 2a to provide isolation and a ground reference, and to allow the impedance seen by the class-D amplifier 204 to be adjusted to a suitable range. More specifically, in the case where the class-D amplifier 204 is configured to include a full-bridge (or H-bridge) output stage, the transformer 206 can effectively convert a differential driving capability of the full-bridge output stage to a single-ended, ground-referenced output signal, without sacrificing the output voltage amplitude. Moreover, the transformer 206 can be configured as a step-up or step-down transformer to tailor the maximum voltage swing at the output, as well as alter the impedance seen by the class-D amplifier 204, thereby ensuring that the class-D amplifier 204 is operating within appropriate current limits and at the rated load impedance.

As further described herein, the class-D amplifier 204 can employ real-time feedback (generally depicted by the primary feedback path(s) 219.1, 219.2; see FIG. 2a) from its output stage for enhanced accuracy and lower distortion. Such feedback, which is typically provided in off-the-shelf class-D amplifier modules, is useful in conventional architectures such as the amplifier interface 100 (see FIG. 1a), because the cutoff frequency, Fc, of the output filter tends to be well outside the audio frequency band of interest, and the signal seen by the load presented by the loudspeaker 110 is about the same as that seen at the output of the class-D amplifier 104, at least within the audio frequency band of interest. In the architecture of the amplifier interface 200 (see FIG. 2a), however, an under-damped resonance is created between the class-D amplifier 204 and the load presented by the ultrasonic transducer 214, so the amplitude of the signal seen by the ultrasonic transducer load is different from that seen by the loudspeaker load and is highly frequency dependent. Further, the phase response 302 changes rapidly in the ultrasonic frequency band of interest, and therefore a direct feedback of the signal at the output of the amplifier interface 200 is difficult to implement. For this reason, rather than using the entire output signal for feedback purposes, the amplifier interface 200 employs a signal representative of the output level in the secondary feedback path 209. In the amplifier interface 200 of FIG. 2a, such a signal is provided by the peak detector 210 to an ultrasonic source/digital signal processor (DSP) 202 to ensure that the signal seen by the ultrasonic transducer load has accurate amplitude, especially with variations in the values of inductance, L, and the capacitance, C. Because the secondary feedback path 209 can include a nonlinear element (e.g., the peak detector 210) rather than a linear filter, such feedback provided by the secondary feedback path 209 can be viewed as being nonlinear. It should be noted, however, that a full-signal, linear filtered, or any other suitable secondary feedback path may be employed. In an alternative embodiment, the peak detector 210 can be replaced with a rectifier or any other suitable signal-conditioning configuration. For higher-speed DSP interfaces, the nonlinear element 210 can be omitted, and the requisite signal conditioning can be performed within the DSP (see reference numeral 202) for the secondary feedback path 209.

The DC bias circuit 211 can apply a suitable DC bias voltage (e.g., 250 Vdc) to the ultrasonic transducer 214 for increased sensitivity and maximum output. In the amplifier interface 200 of FIG. 2a, the DC bias generator 218 feeds the DC bias voltage through the resistor 216, which protects the DC bias generator 218 from a high voltage AC drive signal seen by the ultrasonic transducer load. Further, the capacitor 212 is configured to block the DC bias voltage from the class-D amplifier 204, as well as the transformer 206. The capacitor 212 is provided with a capacitance value suitably high enough to avoid substantially influencing the high voltage AC drive signal being fed to the ultrasonic transducer 214. In an alternative embodiment, the capacitor 212 can be located between the transformer 206 and the inductor 208, and the feedback provided by the secondary feedback path 209 can be obtained directly from the ultrasonic transducer load.

As still further described herein, a compensation filter can be used to flatten the net ultrasound response of the ultrasonic transducer 214. More specifically, the compensation filter can be used to compensate for the non-flat frequency response 222 (see FIG. 2b) in the vicinity of the cutoff frequency, Fc. Such a compensation filter can be implemented by the ultrasonic source/DSP 202, which can be configured to measure the frequency response 222 using the output level provided via secondary feedback path 209. It is noted that the compensation filter can be either fixed to provide a correction for expected values of inductance (L) and/or capacitance (C), or adjustable to account for possible drift in the values of inductance (L) and/or capacitance (C).

In one mode of operation, the ultrasonic source/DSP 202 produces an ultrasonic signal in the ultrasonic frequency band (i.e., 50-70 kHz), and provides the ultrasonic signal to an input of the class-D amplifier 204, which can include a full-bridge output stage. The transformer 206 converts the differential driving capability of the full-bridge output stage to a single-ended, ground-referenced output signal, and provides the output signal to the under-damped or peaking low-pass filter created by the inductance of the inductor 208 and the natural capacitance of the ultrasonic transducer 214, which can be a thin-film ultrasonic transducer. The peak detector 210 provides a signal representative of the output level via the secondary feedback path 209 to the ultrasonic source/DSP 202, which uses the output level to compensate for the non-flat frequency response of the under-damped or peaking low-pass filter near the cutoff frequency, Fc. The DC bias circuit 211 applies a suitable DC bias voltage to the thin-film ultrasonic transducer for increased sensitivity and maximum output.

Having described the above illustrative embodiments of the amplifier interface 200 (see FIG. 2a) and associated amplification methods for ultrasonic devices, other variations and/or modifications can be made and/or practiced. For example, the amplifier interface and amplification methods described herein can be employed in a parametric loudspeaker system configured (i) to receive an audio input signal, (ii) to process the audio signal using a DSP, (iii) to modulate the audio signal to the ultrasonic frequency band using a carrier frequency near the cutoff frequency, Fc, and (iv) to deliver the modulated ultrasonic signal to the amplifier interface 200 for reproduction by the ultrasonic transducer 214. An ultrasonic output produced by the ultrasonic transducer 214 is then demodulated by the nonlinear characteristics of the propagation medium (e.g., the air), converting the ultrasonic output into audible sound that can be heard by a human subject.

It was described herein that the amplifier interface 200 incorporating the class-D amplifier 204 can be used to drive the ultrasonic transducer 214. In an alternative embodiment, the amplifier interface 200 can be used to drive any suitable reactive load, such as an antenna (capacitive) or a coil or motor (inductive—the positions of capacitance, C, and inductance, L, are reversed). In another alternative embodiment, the amplifier interface 200 can be configured to incorporate a class-A amplifier, a class-B amplifier, a class-T amplifier, or any other suitable amplifier normally used to amplify audio signals. In a further alternative embodiment, one or more transient-voltage-suppression (TVS) diodes can be used at the output of the amplifier interface 200 to protect the class-D amplifier 204 from damage due to current spikes that may cause voltage ripples to reflect back through the amplifier interface circuit, potentially reaching the class-D amplifier 204.

As further described herein, the carrier frequency of the modulated ultrasonic signal produced by the ultrasonic transducer 214 can be selected to be near the cutoff frequency, Fc. In an alternative embodiment, such a carrier frequency can be adjusted to enhance the voltage boost of the frequency response of the amplifier interface 200, thereby accounting for inherent variations in the inductance of the inductor 208 and/or the natural capacitance of the ultrasonic transducer 214. In such an alternative embodiment, the carrier frequency can be adjusted at the ultrasonic source/DSP 202 either dynamically during operation or during programmed calibration sequences (such as upon startup), based on the signal representative of the output level provided via the secondary feedback path 209. In a further alternative embodiment, the frequency response 222 of the amplifier interface 200 can be tuned by (i) inserting one or more additional resistors in the signal chain to reduce the peak of the frequency response 222, and/or (ii) inserting one or more inductors and/or capacitors in the signal chain to move the position of the peak of the frequency response 222, as well as the frequency region affected by the voltage boost provided by the frequency response 222, etc.

It was further described herein that the amplifier interface 200 can include the series inductor 208. In an alternative embodiment, the series inductor 208 can be replaced with a secondary inductance in the transformer 206, or an inductor disposed in parallel with the ultrasonic transducer load, resulting in a flat voltage response and reduced current consumption at frequencies close to where the inductance of the inductor 208 and the natural capacitance of the ultrasonic transducer 214 are resonant. In such an alternative embodiment, another low-pass filter (e.g., another L-C filter) can be added before or after the transformer 206, either separately or combined with the inductance of the transformer 206.

While various embodiments of the invention have been particularly shown and described, it will be understood by those skilled in the art that various changes in form and details may be made therein without departing from the scope of the invention as defined by the appended claims.

What is claimed is:

1. An amplifier interface for driving an ultrasonic transducer, comprising:
 a class-D amplifier configured to receive an ultrasonic signal;
 an inductor coupled between the class-D amplifier and the ultrasonic transducer,
 wherein the inductor has an associated inductance value, wherein the ultrasonic transducer has an associated capacitance value, and wherein the inductance value of the inductor and the capacitance value of the ultrasonic transducer form a low-pass filter for removing high frequency artifacts produced by the class-D amplifier;

a digital signal processor (DSP) at an input of the class-D amplifier; and a feedback path disposed between the ultrasonic transducer and the DSP, wherein the ultrasonic transducer is configured to produce an output signal, wherein the feedback path is configured to provide a signal representative of a level of the output signal to the DSP, and wherein the DSP is configured to correct the level of the output signal in response to variations in one or more of the inductance value and the capacitance value.

2. The amplifier interface of claim 1 wherein the feedback path includes one of a peak detector and a rectifier.

3. The amplifier interface of claim 1 further comprising: a transformer disposed between the class-D amplifier and the inductor.

4. The amplifier interface of claim 1 wherein the ultrasonic transducer is a thin-film ultrasonic transducer.

5. The amplifier interface of claim 3 wherein the transformer is configured as a step-up transformer, the step-up transformer being configured to adjust an impedance seen by the class-D amplifier to within a predetermined impedance range.

6. The amplifier interface of claim 3 wherein the transformer is configured as a step-down transformer, the step-down transformer being configured to adjust an impedance seen by the class-D amplifier to within a predetermined impedance range.

7. The amplifier interface of claim 3 wherein the ultrasonic transducer is configured to produce an output signal, and wherein the transformer is configured as a step-up transformer, the step-up transformer being configured to adjust a maximum voltage swing of the output signal delivered to the ultrasonic transducer.

8. The amplifier interface of claim 3 wherein the ultrasonic transducer is configured to produce an output signal, and wherein the transformer is configured as a step-down transformer, the step-down transformer being configured to adjust a maximum voltage swing of the output signal delivered to the ultrasonic transducer.

9. The amplifier interface of claim 3 further comprising: a full-bridge output stage having a differential driving capability, wherein the transformer is configured to convert the differential driving capability of the full-bridge output stage to a single-ended, ground-referenced output signal.

10. The amplifier interface of claim 3 further comprising: an H-bridge output stage having a differential driving capability, wherein the transformer is configured to convert the differential driving capability of the H-bridge output stage to a single-ended, ground-referenced output signal.

11. The amplifier interface of claim 1 wherein the inductance value of the inductor is selected in conjunction with the capacitance value of the ultrasonic transducer so that a load seen from the class-D amplifier is mostly resistive in an ultrasonic frequency band of interest.

12. The amplifier interface of claim 1 further comprising: a transformer disposed between the class-D amplifier and the ultrasonic transducer.

13. An amplifier interface for driving an ultrasonic transducer, comprising:

a class-D amplifier configured to receive an ultrasonic signal;

an inductor coupled between the class-D amplifier and the ultrasonic transducer, wherein the inductor has an associated inductance value, wherein the ultrasonic transducer has an associated capacitance value, wherein the inductance value of the inductor and the capacitance value of the ultrasonic transducer form a low-pass filter for removing high frequency artifacts produced by the class-D amplifier, the low-pass filter having an associated frequency response, wherein the inductance value of the inductor is selected in conjunction with the capacitance value of the ultrasonic transducer to produce a voltage boost in the frequency response at about a center of an ultrasonic frequency band of interest, and wherein the ultrasonic transducer is a thin-film ultrasonic transducer;

a transformer disposed between the class-D amplifier and the inductor; and a DC bias circuit configured to provide a DC bias voltage to the thin-film ultrasonic transducer, wherein the DC bias circuit includes a DC bias generator, an isolation capacitor, and an isolation resistor, wherein the isolation capacitor is disposed in series with the ultrasonic transducer and the transformer, and wherein the isolation resistor is disposed between the ultrasonic transducer and the DC bias generator.

* * * * *